United States Patent [19]

Gaffre

[11] 4,198,251
[45] Apr. 15, 1980

[54] METHOD OF MAKING POLYCHROMATIC MONOLITHIC ELECTROLUMINESCENT ASSEMBLY UTILIZING EPITAXIAL DEPOSITION OF GRADED LAYERS

[75] Inventor: Michel Gaffre, Caen, France

[73] Assignee: U.S. Philips Corporation, New York, N.Y.

[21] Appl. No.: 863,456

[22] Filed: Dec. 22, 1977

Related U.S. Application Data

[60] Continuation of Ser. No. 836,607, Sep. 26, 1977, abandoned, which is a division of Ser. No. 721,289, Sep. 8, 1976, abandoned.

[30] Foreign Application Priority Data

Sep. 18, 1975 [FR] France .................. 75 28632

[51] Int. Cl.² ............... H01L 21/20; H01L 21/82
[52] U.S. Cl. ................... 148/175; 29/569 L; 148/187; 307/311; 313/500; 357/16; 357/17; 357/45; 357/88; 357/90
[58] Field of Search ........... 148/175, 187; 29/569 L, 29/576 E, 578; 313/500; 357/16, 17, 45, 90, 88; 250/211 J; 307/311

[56] References Cited

U.S. PATENT DOCUMENTS

| 3,333,135 | 7/1967 | Galginaitis | 357/17 X |
|---|---|---|---|
| 3,404,305 | 10/1968 | Wright | 357/17 X |
| 3,566,218 | 2/1971 | Widlar et al. | 148/187 X |
| 3,611,069 | 10/1971 | Galginaitis et al. | 148/175 X |
| 3,725,749 | 4/1973 | Groves et al. | 357/17 X |
| 3,890,170 | 6/1975 | Russ | 148/175 |
| 3,947,840 | 3/1976 | Craford et al. | 313/500 X |
| 3,964,940 | 6/1976 | Hart et al. | 148/175 |
| 4,001,056 | 1/1977 | Groves et al. | 148/175 |
| 4,012,243 | 3/1977 | Keil et al. | 148/175 |
| 4,142,196 | 2/1979 | Diguet et al. | 357/17 |

FOREIGN PATENT DOCUMENTS

49-45040 12/1974 Japan.

OTHER PUBLICATIONS

Blum et al., "Integrated Multicolor Light-Emitting Diode Array", IBM Tech. Discl. Bull., vol. 15, No. 2, Jul. 1972, pp. 445–446.
Murray et al., "Lighting up in a Group", Electronics, Mar. 4, 1968, pp. 104–110.
Craford et al., "L.E.D. Technology", Solid State Technology, Jan. 1974, pp. 39–58.

*Primary Examiner*—L. Dewayne Rutledge
*Assistant Examiner*—W. G. Saba
*Attorney, Agent, or Firm*—Thomas A. Briody; Paul R. Miller

[57] ABSTRACT

A monolithic assembly comprising electroluminescent diodes emitting radiations of different wavelengths. The junctions of the said diodes are established in different sectors of a layer of a semiconductor compound where the concentration of a given impurity is variable. Also, the manufacture of polychromatic integrated emission devices.

3 Claims, 2 Drawing Figures

METHOD OF MAKING POLYCHROMATIC MONOLITHIC ELECTROLUMINESCENT ASSEMBLY UTILIZING EPITAXIAL DEPOSITION OF GRADED LAYERS

This is a continuation of application Ser. No. 836,607 filed Sept. 26, 1977 now abandoned, which in turn is a divisional application of Ser. No. 721,289, filed on Sept. 8, 1976, now abandoned.

The invention relates to a monolithic electroluminescent semiconductor assembly comprising at least two electroluminescent diodes omitting two radiations of different wavelength and localised straight above two distinct areas of the surface of a semiconductor layer of a homogeneous semiconductor compound doped by at least one impurity.

The present invention also relates to a method of manufacturing said monolithic semiconductor assembly.

Electroluminescent diodes are used for visual display notably in data processing techniques. A binary logic state may be displayed by means of an electroluminescent diode taking two states: bright diode, dark diode. However, in the case of a strong ambient light, the effects of reflection of the optics of the diodes may involve interpretation errors. For that reason it is to be preferred to visualise the various logic states by means of diodes emitting under various wavelengths, e.g., in the red and in the green. A first possibility consists in disposing side by side the necessary diodes, each of said diodes comprising its own envelope and optics. The dimensions of such a device soon become prohibitive.

In order to mitigate said drawback it has been tried to manufacture devices comprising two and even three diodes which are superimposed in the thickness of a composite semiconductor body formed from successive layers of different materials (or identical nominal composition but of different stoichiometry, or even differently doped), certain of the interfaces between the said layers corresponding to semiconductor junctions and to the emission of radiations of specific wavelengths. Such a device which is described notably in French Pat. No. 2,069,256, requires a good transparency of the surface layers of the semiconductor body to the light radiation emitted by those of the junctions which are situated deep in the body. In practice, it has been found on the contrary, that the light absorption level is often important.

Actually, the deepest junctions are situated at several tens of microns from the emission face of the semiconductor block, because of first the thickness itself of the successive layers, and then, because it is often necessary, in order to obtain a satisfactory crystal connection between the layers, to interpose between them "coupling layers" of variable composition, the presence of which increases the thickness of the structure and results in a supplementary absorption of the emitted light.

Moreover, the manufacture of devices of the type described in such U.S. Pat. No. 2,069,256 requires besides operations of depositing successive layers which are always delicate, localised engraving and etching operations which are also delicate in order, on the one hand, to give to the emitting junctions equal emissive surfaces and, on the other hand, to establish electric contact areas on different planes and situated outside the path of the light rays.

It is an object of the present invention to mitigate the drawbacks of the known devices such as those of the type mentioned above and to realise an assembly of electroluminescent diodes emitting different lights integrated in a same monolithic body of a plane structure, which assembly is easily manufacturable by known techniques.

The invention is based on the established fact that the emission wavelength of a luminescent semiconductor material is influenced at least partly by the impurity level which it contains.

According to the invention, an electroluminescent monolithic semiconductor assembly comprises at least two electroluminescent diodes emitting two radiations of different wavelengths, localised directly above two distinct areas of the surface of a semiconductor layer of a homogeneous semiconductor compound doped by at least one impurity. The junctions of the said diodes are established in sectors of the layer where the concentration of the said impurity is different.

Advantageously, the semiconductor layer is composed of at least two superimposed layers between which the concentrations of the said impurity differ, but within which each of the concentrations remains constant at all the levels.

Since the two junctions of the semiconductor assembly are established in two sectors of the semiconductor layer where the impurity content differs, the active parts of the sectors adjacent the junctions emit in bands of different wavelengths. Since the junctions are moreover situated straight above distinct areas of the surface of the semiconductor layer—advantageously chosen near each other—the drawbacks due to the superposition of emissive centres emitting radiations of different wavelengths are eliminated.

No matter what the levels are at which the junctions can be established in the thickness of the semiconductor layer, the light emitted in the direction of the outer face of the layer needs to traverse only a homogeneous material, which is an important advantage. Of course, the doping should be arranged in such manner in the layer that the light emitted from the deep levels can emerge and experiences only a minimum absorption.

Since the active layer is single, the problem of the crystal connections between layers of different composition, which appears notably during the manufacture of assemblies having superimposed diodes, does not present itself with a structure according to the invention. The correlative absence of coupling layers the thicknesses of which are usually of the order of 20 to 25 $\mu$m, contribute to the decrease of the overall thickness of the structure and consequently to the decrease of light losses by absorption, which represents an important advantage of the said structure.

On the other hand the assembly according to the invention presents the advantage, by its simplicity, of being easy to manufacture: it is sufficient, during the growth of the semiconductor layer, to judiciously control the supply of the doping element, as will be shown hereinafter. The constitution of the semiconductor layer itself, due to its homogeneity, is comparatively simple with respect to that of layers of complex chemical formula (for example, the layers of ternary compounds often used for the manufacture of electroluminescent devices and of which it is necessary during the growth to vary the respective proportions of two of the elements).

In addition to the specific advantages mentioned above the more general advantage should also be considered of obtaining an assembly in which the diodes, perfectly distinct because they are localised straight above distinct areas of the surface of the semiconductor layer, are well visible while excluding any risk of color interpretation errors as it may present itself with assemblies having superimposed diodes.

The assembly according to the invention is preferably manufactured from materials which are known for their good electroluminescent qualities and are susceptible of being deposited in epitaxial layers, for example, the semiconductor compounds comprising at least one element of column III and at least one element of column V of the periodic table of elements.

In a particularly advantageous embodiment permitting the obtaining diodes having different colors, going from red to green when passing through orange and yellow, the material chosen is gallium phosphide and this material is doped with nitrogen in the conditions provided by the invention.

It is known that the luminescence of gallium phosphide is susceptible to appearing on various bands of visible wavelengths according to the nature of the dopant used and in particular according to the concentration of nitrogen in the material. This property has already been used advantageously for the manufacture of electroluminescent diodes or assemblies of electroluminescent diodes having monochromatic emission. However, to the knowledge of applicants there have not yet been presented assemblies formed by non-superimposed integrated diodes having polychromatic emission based strictly on this same property.

Hence, as far as gallium phosphide and its dopant nitrogen are concerned, taken here as an example, it is known that an emission in the green corresponds with a concentration of the order of $10^{18}$ atoms/cm$^3$ (the exact concentration level depends of course on other parameters, inter alia those characterising the growth conditions of the semiconductor layer) while for the orange-red a concentration of approximately $10^{20}$ atoms/cm$^3$ should be reached.

On these bases Applicants propose, preferably and within the scope of the invention, an assembly manufactured on a substrate of gallium phosphide and comprising a layer of gallium phosphide obtained by epitaxy from the vapour phase (by means of this method higher concentration levels of nitrogen can be obtained than by any other method, in particular the method of epitaxy from the liquid phase), the layer being composed of at least two superimposed layers of which the first—nearest to the substrate—is doped, for example, with a nitrogen concentration of $10^{20}$ atoms/cm$^3$ throughout its thickness, and the second is doped with $10^{18}$ atoms/cm$^3$, also throughout its thickness. Two junctions have been formed in the structure, for example by diffusion from the surface of the second layer; one of the junctions is situated in the thickness of the first layer and the other junction has been formed in the thickness of the second layer. So the junctions are staggered at different levels of the same semiconductor layer of a homogeneous semiconductor compound and they are established in two sectors of the said layer where the nitrogen concentration is different, as is provided by the invention.

The use of nitrogen as an impurity having a variable concentration level does not exclude the presence of a complementary doping element itself used under a fixed or variable concentration level so as to give the layer a given conductivity type. For example, with nitrogen may be combined an element selected from column VI of the periodic table, such as sulphur or tellurium, which gives the epitaxial layer an initial n-type conductivity. The junctions are then formed by diffusion of an element chosen from column II of the periodic table, for example zinc or cadmium.

The exact conditions permitting the manufacture of a device as described above, as well as the physical characteristics of the device, are given in the descriptive part of the present specification.

Of course, said device may comprise on the same semiconductor plate an important number of diodes some emitting in a certain light spectrum, and some emitting in a spectrum different from the first. In all the cases it is advantageous to divide the semiconductor layer into insulating compartments according to a disposition well known in semiconductor technology, each compartment delimiting the domain occupied by a given diode. An absorbing layer may also be disposed between the substrate and the first epitaxial layer, which layer is destined to impede the radiation towards the rear face opposite to the semiconductor layer of the substrate, which radiation, in particular by reflection on the said rear face, may traverse again the substrate, mix with the primary light and alter the purity. The simplicity of the assembly according to the invention is such that it permits the use of all known dispositions susceptible to adapting the operation to particular cases, while employing known techniques.

On the other hand it is perfectly conceivable to cause an assembly according to the invention to emit more than two distinct radiations. For three radiations, and in the embodiment described above, the semiconductor layer would thus comprise three superimposed gallium phosphide layers that each has a constant nitrogen concentration in each layer (and, possibly, having a constant or variable concentration of at least one other doping element), but decreasing in steps in the direction of the surface, the junctions being established in each of the layers, so for example at three different levels of the layer.

In all the cases, no matter what is the number of radiations susceptible to being generated simultaneously or alternately, it is clear that a decreasing order of the nitrogen concentration from the substrate towards the surface of the semiconductor should be respected which corresponds to an increasing order of the frequency of the emitted light vibrations, this in order to avoid a sometimes total absorption of one or/and the other of said radiations.

The present invention may be applied notably to the manufacture of light devices having polychromatic emission, of light signals, of display devices, in particular devices for displaying logic states.

The invention will be described in greater detail, by way of example, with reference to the accompanying drawing, in which.

Figure 1:
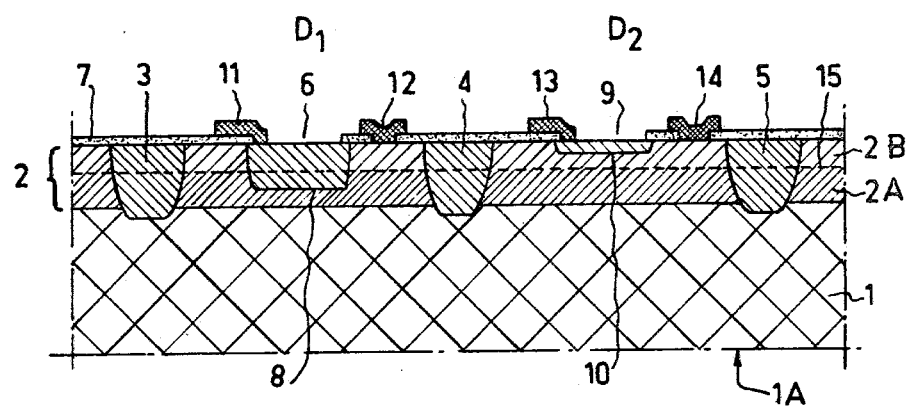
FIG. 1 is a partial diagrammatic sectional view of an assembly according to the invention in an advantageous embodiment.

The assembly shown in FIG. 1 is manufactured in a monolithic semiconductor plate formed by a substrate 1 on which an epitaxial layer 2 of a homogeneous semiconductor compound has been deposited. The layer 2 is doped by at least one impurity.

According to the invention, the layer 2 is composed of sectors, where the concentration of the impurity is distinct. In this case, for example, two sectors are distinguished in the layer 2: a first sector corresponds to a first epitaxial layer 2A deposited on the substrate 1, at the interior of which there is a constant impurity concentration at a first level; a second sector corresponds to a second epitaxial layer 2B superimposed upon the first at the interior of which there is a constant impurity concentration at a second level.

The epitaxial layer 2 has been separated into compartments by insulation partitions such as 3, 4, 5. According to the invention, in a first compartment limited by the partitions 3 and 4, straight above an area of the surface of the layer 2 defined by the window 6 cut in the insulating layer 7, has been formed a first electroluminescent diode D1 of which the junction 8 is established in the first sector 2A of the said layer; in a second compartment limited by partitions 4 and 5, straight above another area of the surface of the layer 2 defined by the window 9, has been formed a second electroluminescent diode D2 of which the junction 10 is established in the second sector 2B of the layer 2.

Contact pads, produced by two metallic deposits 11 and 12 for the diode $D_1$, 13 and 14 for the diode $D_2$, permit the provision of the necessary electrical connections with the structure.

It is noted that the two junctions 8 and 10 are established at distinct levels of the layer 2 where, if the material of the said layer is identical as regards the basic chemical formula, the concentration of doping impurities is different. The adequate use of a material and a suitable impurity results in diodes $D_1$ and $D_2$ emitting radiations of different wavelengths: for example, the deep junction 8 of the diode $D_1$ produces a light of dominant orange, while the surface junction 10 of the diode $D_2$ produces a light of medium green tone.

In the assembly as described above the diodes $D_1$ and $D_2$ are insulated in compartments. Such a disposition, already used to advantage by Applicants, notably in the structure described in the patent application of addition U.S. Pat. No. 2,080,849, is favourable, even necessary, in many cases in which the diodes must be entirely independent. In this case, however, this disposition keeps an optional character which has nothing to do with the object of the invention. According to another known disposition, there could even have been provided a light isolating layer between the substrate 1 and the sensitive layer 2 destined to avoid a light transmission in the direction of the rear face of the substrate. Moreover and according to a known embodiment of assemblies of this type, the contacts 12 and 14 could have been replaced by a common contact layer deposited on the rear face 1A of the substrate 1, this, of course, in the case in which the material of the substrate 1 has a low resistivity. These two latter dispositions—presence of a light isolating layer and a common contact layer—also keep an optional character independent of the object of the invention.

A practical embodiment according to FIG. 1 uses gallium phosphide as a semiconductor compound and nitrogen as a main doping impurity in the operating conditions described hereinafter.

The substrate 1 is of gallium phosphide, for example having a semi-insulating character, having a resistivity between $10^4$ and $10^7 \Omega$ cm or even of the p-conductivity type.

On the substrate 1 which is suitably prepared the layer 2 is grown by epitaxy from the vapour phase. The operation is carried out in an apparatus of the conventional model—well known to those skilled in the art and of which it is consequently useless to give a description—in which the epitaxy furnace comprises three hot zones. In the first zone where the temperature is between 780° and 820° C. is placed gallium; there arrive hydrogen (supply: 1500 cm$^3$/min.±1%) which serves essentially as a dilution gas, and hydrochloric acid (supply: 42 cm$^3$/min.±1%). In the second zone, or mixing zone of the gases, situated downstream of the first zone with respect to the direction of flow of the preceding hydrogen flow, heated at 950° C. (930° to 970° C.), are sent hydrogen (supply: 12000 cm$^3$/min.±1%) which serves as a carrier gas, phosphine, PH$_3$, diluted to 5% in hydrogen (supply: 515 cm$^3$/min.±1%), diethyltelluride, Te(C$_2$H$_5$)$_2$, diluted to 10 ppm in hydrogen (supply: 150 cm$^3$/min.±1%) and ammonia. In the third zone or deposition zone which succeeds the second zone and within which is placed the substrate of gallium phosphide, the temperature is controlled between 785° and 795° C.

All figures given above remain fixed during the deposition of the whole epitaxial layer 2. Only the supply of ammonia gas varies which, for the growth of the epitaxial layer 2A, is, for example, fixed at 455 cm$^3$/min.±1%), which corresponds to a partial pressure of $3.2 \times 10^{-2}$ Atm. When the epitaxial layer 2A has reached the desired thickness, the ammonia supply—and only the ammonia supply—is rapidly modified to reduce it, for example, to 25 cm$^3$/min.±1%), for example a partial pressure of said gas being at $1.7 \times 10^{-3}$ Atm.; the epitaxial layer 2B is then formed.

In these conditions an epitaxial layer 2 is obtained which grows at the rate of approximately 20 $\mu$h and which is of the n-conductivity type. The doping level connected with the impurity telluride is $4.10^{16}$ to $2 \times 10^{17}$ atoms/cm$^3$; and is constant in the whole layer 2.

The presence of nitrogen resulting from the decomposition of ammonia gas gives a doping impurity level of $5 \times 10^{19}$ to $10^{20}$ atoms/cm$^3$ to the epitaxial layer 2A and of 1 to $3 \times 10^{18}$ atoms/cm$^3$ to the epitaxial layer 2B.

The thickness of the layer 2A is chosen to be between 15 and 25 $\mu$m (advantageously 20 $\mu$m), while the said layer 2B has a thickness of 8 to 15 $\mu$m (preferably 10 $\mu$m). The overall thickness of the active layer 2 thus is between 23 and 40 $\mu$m.

When the layer 2 has been formed, insulation partitions 3, 4 and 5 are formed, for example by diffusion, from the surface of the layer 2B, of an impurity of the p-type such as zinc, for example by proton bombardment.

The diodes $D_1$ and $D_2$ are then formed. For example, by a first zinc diffusion localised in the window 6 continued for 2 hours at 850° C. (845° to 855° C.) in a vacuum, the deep junction 8 of the diode $D_1$ is formed. In a subsequent sequence of zinc diffusion carried out in the window 9 this time for 30 min. at 850° C. in a vacuum, the surface junction 10 of the diode $D_2$ is formed.

The depths of the diffusions forming the junctions 8 and 10, taken between each junction and the upper limit of the epitaxial layer in which the said junction is situated, are chosen to be at least equal to 1 to 3 times the diffusion length of the minority carriers in the epitaxial region in question. Given the operating conditions described before, the junction 8 is situated at 5 μm below the fictive boundary between the layers 2A and 2B, while the junction 10 is 7 μm deep with respect to the surface of the layer 2B, this for a layer 2B having a thickness of 10 μm.

To complete the assembly, there remains the metallic deposits of the contact pads to be formed, preferably by using an alloy of gold-beryllium on the p-type regions (contacts 11 and 13) and an alloy of gold-silicon on the n-type regions (contacts 12 and 14).

The assembly as manufactured according to the operating conditions described above can emit a light having a medium yellow color (centered on a wavelength of 0.572 μm) by its diode $D_1$. The diode $D_2$, whose junction 10 is established in a sector of the layer 2 where the doping level of nitrogen is lower than that of the sector where the junction 8 of the diode $D_1$ is situated, emits green (around the wavelength of 0.560 μm). Of course, by varying the partial pressure of ammonia which determines the doping level of the layer 2 of nitrogen, the spectral characteristics of the light emitted by the manufactured diodes can be modified. Applicants have found that within the scope of the operating conditions described, only the supply of ammonia being variable, with partial ammonia pressures of $1.7 \times 10^{-3}$, $3.2 \times 10^{-2}$ and $1.2 \times 10^{-1}$ Atm. correspond emissions centered at 0.560 μm (green), 0.572 μm (yellow), and 0.596 μm (orange-red), respectively. Great possibilities of adjusting the light emission are connected with the adoption of intermediate partial ammonia pressures between those indicated above: with partial pressures of $6.5 \times 10^{-3}$ and $6.6.10^{-2}$ correspond, for example, emissions of which the average wavelengths are situated at 0.565 μm and 0.578 μm, respectively.

It will be observed that, without great complication of the operating process described above, the supply of carrier gas of the complementary impurity (in this case tellurium) will be varied in order to modify the concentration level of the epitaxial layer of said impurity and thus adjust the characteristics of the emission spectra of the diodes. If necessary, it may be arranged that the various layers of the epitaxial layer have distinct concentration levels of the said complementary impurity.

In the same manner, and always in a very simple manner, it may be arranged that the concentration levels of each of the impurities—nitrogen and tellurium (or rather any impurity other than tellurium)—are variable within the same epitaxial layer.

It is interesting to note, as already indicated in the first part of the present description and as it appears clearly from FIG. 1, that the assembly according to the invention has a very simple structure, the simplicity also characterising the method of manufacturing said assembly. It should be noted in particular that the heart of the assembly is limited to a single epitaxial layer 2 of a small thickness (23 to 40 μm for a bichromatic emission) of a homogeneous material. To that effect should be disregarded the broken line 15 drawn between the layers 2A and 2B only to materialise a transition which does not anywhere touch the material itself of the layer, but solely relates to its doping characteristics.

It is not excluded to use an assembly according to the invention by considering the light emission which is effected via the rear face 1A of the substrate 1 in so far as the substrate has a suitable transparency. In this case, however, it is clear that, if the epitaxial layers 2A and 2B remain doped as has been indicated in the embodiment (layer 2A more highly doped with nitrogen than layer 2B), the light emitted towards the substrate 1 by the junction 10 will be absorbed, at least partly, during traversing the layer 2A and the emission will be monochromatic. So in the case of such a use, it should be ensured for the emission to remain polychromatic that the doping levels of nitrogen in the successive epitaxial layers are increasing from the substrate 1 up to the surface of the layer 2.

Figure 2:
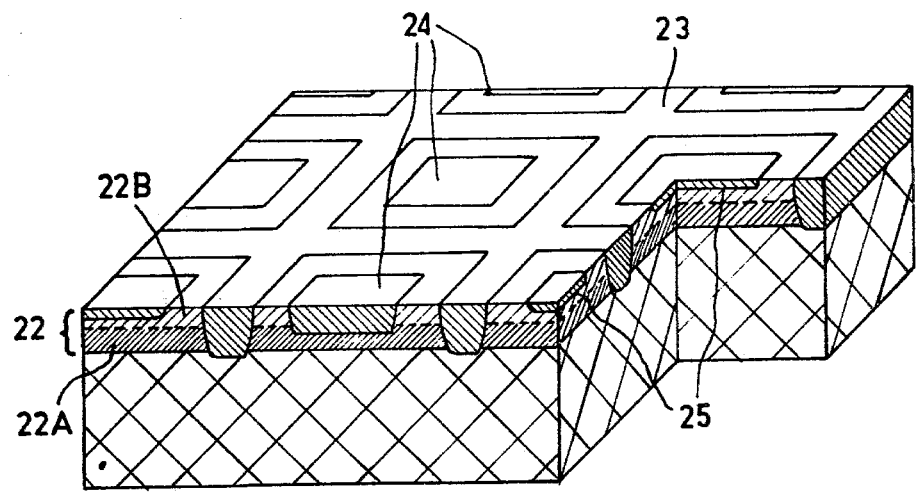
FIG. 2 is a partial perspective view of an integrated electroluminescent semiconductor device having bichromatic emission and comprising a number of diodes manufactured according to the invention.

The device shown partly in FIG. 2 is a mosaic of electroluminescent diodes disposed in columns and arranged according to two orthogonal directions and which is made of a series of assemblies such as that of FIG. 1.

The diodes, for example 24, result from the simultaneous formation of pn-junctions in the lower part 22A of the epitaxial layer 22, while the diodes, for example 25, have their junctions—also formed simultaneously—in the surface part 22B of the said layer 22. As above, the difference between the two parts 22A and 22B resides in the doping characteristics and not in the nature and the structure of said parts. Each of the diodes 24 or 25 is insulated in a compartment by partitions connected as a grid 23.

The connections which are not shown in FIG. 2 are realised by multilayer techniques commonly used in the manufacture of electronic microcircuits and consisting of depositing in several successive layers separated by insulating layers in the necessary regions a conductor metal according to the structure of the desired circuit in such manner as to be able to apply excitation voltages to one or several determined diodes.

It will be obvious already from FIG. 2 that the manufacturing process of such a device does not differ at all from that described for the assembly shown in FIG. 1.

Thus the invention may be applied to any assembly comprising a plurality of electroluminescent elements formed within a monolithic body and susceptible of emitting at different light wavelengths.

What is claimed is:

1. A method of manufacturing a monolithic electroluminescent semiconductor assembly comprising the steps of forming a semiconductor layer of a homogeneous semiconductor compound doped by at least one doping impurity, said semiconductor layer having an impurity concentration decreasing toward a surface of said semiconductor layer, forming at least two electroluminescent diodes that emit respective radiations of different wavelengths at at least two distinct respective areas of said surface by forming at least first and second respective junctions in said semiconductor layer, said first junction being at a more highly doped part of said semiconductor layer than said second junction, wherein said semiconductor layer is formed in a single epitaxial operation from the vapor phase during which only the supply of gas including nitrogen as said at least one doping impurity is varied.

2. A method of manufacturing a monolithic electroluminescent semiconductor assembly as in claim 1, wherein said single epitaxial operation is performed on a substrate of gallium phosphide in an epitaxial reactor comprising three zones, including (a) a first zone at a temperature between 780° and 820° C., where gallium is placed, and where hydrogen (supply: 1500 cm$^3$/min.±1%) and hydrochloric acid gas (supply: 42 cm$^3$/min.±1%) arrive, (b) a second zone heated between 930° and 970° C. where hydrogen (12000 cm$^3$/min.±1%), phosphine diluted to 5% in hydrogen (supply: 515 cm$^3$/min.±1%), diethyltelluride diluted to 10 ppm in hydrogen (supply: 150 cm³/min. ±1%), and ammonia arrive, and (c) a third zone at a temperature between 785° and 795° C. where a substrate of gallium phosphide is placed, and, at a first point in time, said ammonia supply is fixed at a first value and remains stable during the growth of a first epitaxial layer and at a second point in time, said ammonia supply is fixed at a second value and remains stable during the growth of a second epitaxial layer, and subsequently diffusing a further impurity from the surface of the second epitaxial layer to form the junctions of said diodes.

3. A method of manufacturing a monolithic electroluminescent semiconductor assembly as in claim 2, wherein said ammonia is provided in a range corresponding to limited partial pressures of $1.7 \times 10^{-3}$ and $1.2 \times 10^{-1}$ Atm., respectively.

* * * * *